United States Patent [19]

Bynum

[11] Patent Number: 5,088,047
[45] Date of Patent: Feb. 11, 1992

[54] AUTOMATED MANUFACTURING SYSTEM USING THIN SECTIONS

[76] Inventor: David K. Bynum, 1460 Rue de Trust, Erie, Colo. 80516

[21] Appl. No.: 421,840

[22] Filed: Oct. 16, 1989

[51] Int. Cl.$^5$ .......................... G06F 15/46; B27N 3/00
[52] U.S. Cl. ..................... 364/474.24; 156/58; 156/62.2; 156/272.8; 156/379.8; 264/22; 264/24; 364/468; 425/174.4
[58] Field of Search ................ 364/474.24, 468, 473; 264/22, 308, 24, 40.1, 241, 255; 425/174, 174.4; 156/58, 59, 62.2, 272.2, 272.4, 272.6, 272.8, 273.1, 273.3, 273.5, 275.5, 275.7, 378, 379.6, 379.8, 64; 427/43.1, 54.1; 430/269, 270, 945

[56] References Cited

U.S. PATENT DOCUMENTS

| | | | |
|---|---|---|---|
| 3,687,661 | 8/1972 | Sato | 430/42 |
| 3,988,520 | 10/1976 | Riddle | 428/15 |
| 4,041,476 | 8/1977 | Swainson | 365/119 |
| 4,078,229 | 3/1978 | Swainson | 365/119 |
| 4,238,840 | 12/1980 | Swainson | 365/119 |
| 4,288,861 | 9/1981 | Swainson | 365/127 |
| 4,430,718 | 2/1984 | Hendren | 364/475 |
| 4,510,223 | 4/1985 | Kuehnle et al. | 430/44 |
| 4,575,330 | 3/1986 | Hull | 425/174.4 |
| 4,598,376 | 7/1986 | Burton et al. | 364/470 |
| 4,641,270 | 2/1987 | Lalloz et al. | 364/476 |
| 4,654,282 | 3/1987 | Ng et al. | 430/54 |
| 4,665,492 | 5/1987 | Masters | 364/468 |
| 4,752,352 | 6/1988 | Feygin | 156/630 |
| 4,801,477 | 1/1989 | Fudim | 264/22 X |
| 4,915,757 | 4/1990 | Rando | 364/474.08 X |
| 4,938,816 | 2/1990 | Beaman et al. | 264/22 X |
| 4,961,154 | 10/1990 | Pomerantz et al. | 264/22 X |
| 5,002,854 | 3/1991 | Fan et al. | 264/22 X |

FOREIGN PATENT DOCUMENTS 45-16614  9/1970  Japan .
2197502 A  5/1988  United Kingdom .

Primary Examiner—Joseph Ruggiero

[57] ABSTRACT

A method for automatically manufacturing objects directly from computer aided design, whereby the computer programming electronically sections the designed object into many thin planar sections which are physically reproduced as laminae formed from sheet materials or powders by one of the embodiments of the invention. The thin planar laminae thus formed are bonded to form a sandwich creating the object as designed.

14 Claims, 4 Drawing Sheets

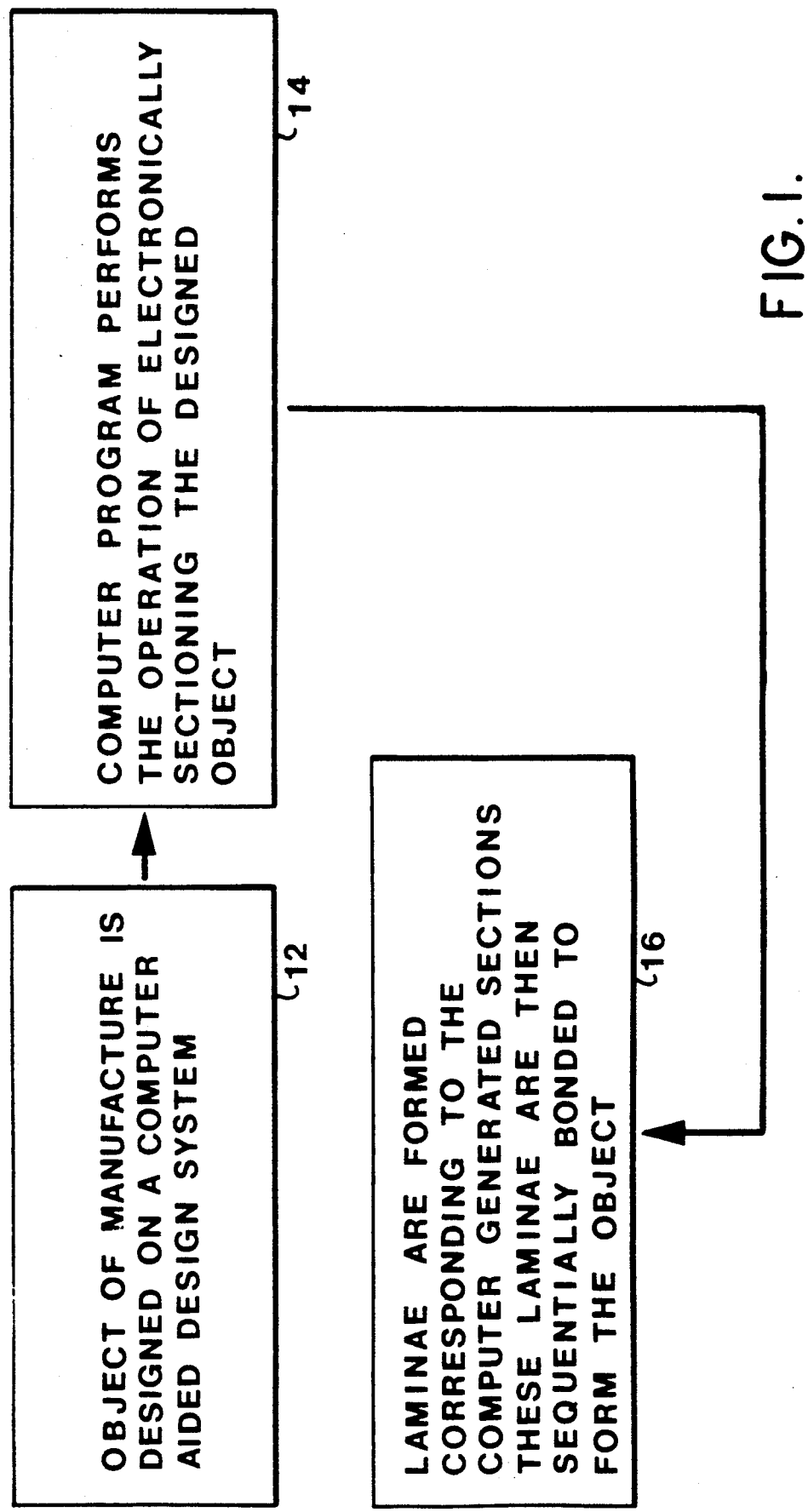

AUTOMATED MANUFACTURING SYSTEM USING THIN SECTIONS

BACKGROUND—FIELD OF INVENTION

This invention relates to the automated manufacture of three-dimensional objects directly from computer aided design. More particularly, this invention relates to improvements in the methods of manufacture whereby thin sections, of a designed article, are electronically generated and under automatic computer control, thin layers corresponding to the electronic sections are formed then fused together to form the article as designed. The most common name for these devices is three-dimensional printers.

BACKGROUND—DESCRIPTION OF THE PRIOR ART

There has long existed the need in industry for the rapid and economical production of designed articles for prototype study or short run fabrication.

Traditional methods of design, prototype fabrication and the setup and tooling for production have been tedious, labor intensive and expensive. The process typically involves designing the article, and any sub-assemblies that are required, fabrication of the prototype by hand from working drawings, review of the prototype and repetition of these steps until the design is consummated. Then the steps required to produce the article are undertaken which involve tooling, mold making and assembly line setup. These labor intensive costly steps are only economically feasible for relatively large production runs where the setup cost can be disbursed over many units.

Some advancements have been made with the advent of computer aided design and drafting equipment (CAD). Computer aided design and drafting equipment allow for the rapid alteration of design. Changes and variations can be readily made and studied. Until recently the design was still plotted on paper and submitted to skilled artisans for the laborious process of hand making prototypes.

Recently techniques have been developed in the art for generating three dimensional objects directly from computer design. Early efforts in this direction were disclosed in U.S. Pat. Nos. 4,041,476 Aug. 9, 1977, 4,078,229 Mar. 7, 1978, 4,238,840 Dec. 9, 1980 and 4,288,861 Sept. 8, 1981 all to Swainson. All of these systems were attempts to generate three-dimensional objects using a fluid medium that can be selectively cured by converging beams of radiation, such as light, within the curable liquid to provide synergistic energy sufficient at the points of intersection to harden the liquid. However, problems such as distortion and deflection of the energy beam passing through the liquid and the accompanying loss of intensity and resolution have limited the application of these techniques. Improvements in these processes were reported in U.S. Pat. No. 4,575,330 issued to Hull, Mar. 11, 1986. Hull's patent discloses a process termed stereolithography, whereby the electronic output of a computer aided design system is used to directly fabricate a three-dimensional object. The process is described as a method and apparatus for fabricating solid objects by successively "printing" thin layers of a curable material e.g., ultraviolet curable polymer one on top of the other. Under computer control, a spot of ultraviolet light moves across the surface of a vat of ultraviolet light curable liquid to form a thin layer corresponding to a cross-section of the designed object. After the first thin layer is formed, the second and each successive layer is formed by lowering the object, under development, into the curable liquid by a distance corresponding to the width of one layer allowing uncured liquid to flow over the object. The new thin layer is cured in the above described fashion. This process is continued until the complete object is formed.

U.S. Pat. No. 4,961,154 issued Oct. 2, 1990, to Pomerantz et al. shows a three-dimensional modeling apparatus. This patent shows various improvements of the above mentioned three-dimensional printing method presented in U.S. Pat. No. 4,575,330 issued 1986 to Hull. All but one of the methods disclosed by Pomerantz are based on photo-cure liquids using ultra-violet light to harden the layers. One of Pomerantz's objectives is to speed up the process of using photo-cure polymers in three-dimensional printers. His approach is to use masks and a strong source of ultra-violet light rather than using a laser to directly expose, harden and form the layers from the photo-cure polymer. Several methods are presented for making the masks. He suggests using photographic film in one method and in another method an electro-photographic printer is used to print masks on glass and plastic. The resulting glass slide is positioned in a standard slide projector whereby the image is projected onto the polymer to harden the layers.

The electro-photographic method is used only as a photographic film substitute to make masks for exposing the photocure polymer. The electro-photographic method is not used to directly build up the layers that form the object as disclosed in the present application. The mask on the plastic and glass slide is erased after use and a new mask corresponding to the next section is formed in its place. The present invention physically bonds the layers formed by the electro-photographic apparatus to form the object.

While the above methods represent a welcomed advance in the art, there are unfortunately shortcomings. The photo-cure polymers are relatively expensive when compared to other plastic resins more commonly available. These processes by being restricted to the use of only liquid photo-cure polymers also restricts the available physical and chemical properties. The object can not be fabricated from more than one material at a time e.g., a transparent material and an opaque material. Also some light piping and scatter would occur that would prevent the rendition of fine detail in the formed object. These shortcomings limit these processes to use for creating prototype study models rather than being true manufacturing methods or working model generators.

In addition, as these systems are liquid based, their deployment are limited to vibration free environments and to environments with gravational fields. These two factors prevent these methods from being used at sea or in space where the ability to fabricate a working replacement part would prove to be a useful application of the art.

SUMMARY OF THE INVENTION

The present invention is disclosed herein as several embodiments that have in common the following steps. A three-dimensional object is designed using a computer aided design system. A computer program performs the operation of electronically sectioning the designed object into thin parallel planes, storing these thin sections in computer memory and then outputting this stored electronic data to one of the manufacturing embodiments of the invention. There are commercially available three-dimensional CAD programs that contain the requisite three-dimensional modeling and sectioning features. One such program is marketed by Auto-Desk Inc. of Sausalito, Calif., under their product trademark Auto-CAD version eleven with Advanced Model Extension AME. This software not only contains the required three-dimensional modeling feature, but can directly output to many peripheral devices including the present invention. The data is transferred either directly or indirectly by way of electronic storage media such as magnetic disks. The data may also be transferred remotely by the use of telephone lines or radio waves. After having received the data, one of the manufacturing embodiments uses the electronic sectional information to form thin layers or laminae corresponding to the sections and bonding these thin sections sequentially to form the object as designed.

OBJECTS AND ADVANTAGES

Accordingly several objects and advantages of my invention are:

(a) to provide a method and apparatus to automatically manufacture a variety of objects directly from design without the need for human manipulated intermediate steps, (b) to provide a method and apparatus whereby an object or article of manufacture is designed by an operator of a computer aided design system. The object thus designed is electronically sectioned by the computer's programming into many thin sections corresponding to successive parallel planes through the designed object. The sectional information thus created is used to physically create thin laminae from polymers, metals or the like. The laminae thus created are automatically sequentially bonded by the apparatus to physically manufacture the object, (c) to create a method and apparatus whereby objects can be designed at one location and the design information thus formed can be transmitted or stored electronically and retrieved for automatic manufacture at a different location or at a later time, (d) to create a method and apparatus whereby an object can be designed and automatically manufactured at various scales, (e) to create a method and the accompanying apparatus whereby many variations in an object's design can be realized rapidly and economically, allowing changes in form, scale and material composition to be studied and evaluated, (f) to provide a method and apparatus whereby mechanical objects containing several subassemblies can be automatically manufactured in unison with all parts assembled and in working order, (g) to provide a method and apparatus of automatically manufacturing molds to be used in the casting of objects, (h) to create a method and apparatus whereby objects can be manufactured from many different materials with varying physical and chemical properties, and (i) to create a method of automatic manufacture that produces objects at a lower cost than previously available methods.

BRIEF DESCRIPTION OF THE DRAWINGS

In the drawings closely related figures have the same number but different alphabetic suffixes.

FIG. 1 shows a schematic representation of the method of the invention.

REFERENCE NUMERALS USED IN DRAWINGS

Figure 2A:
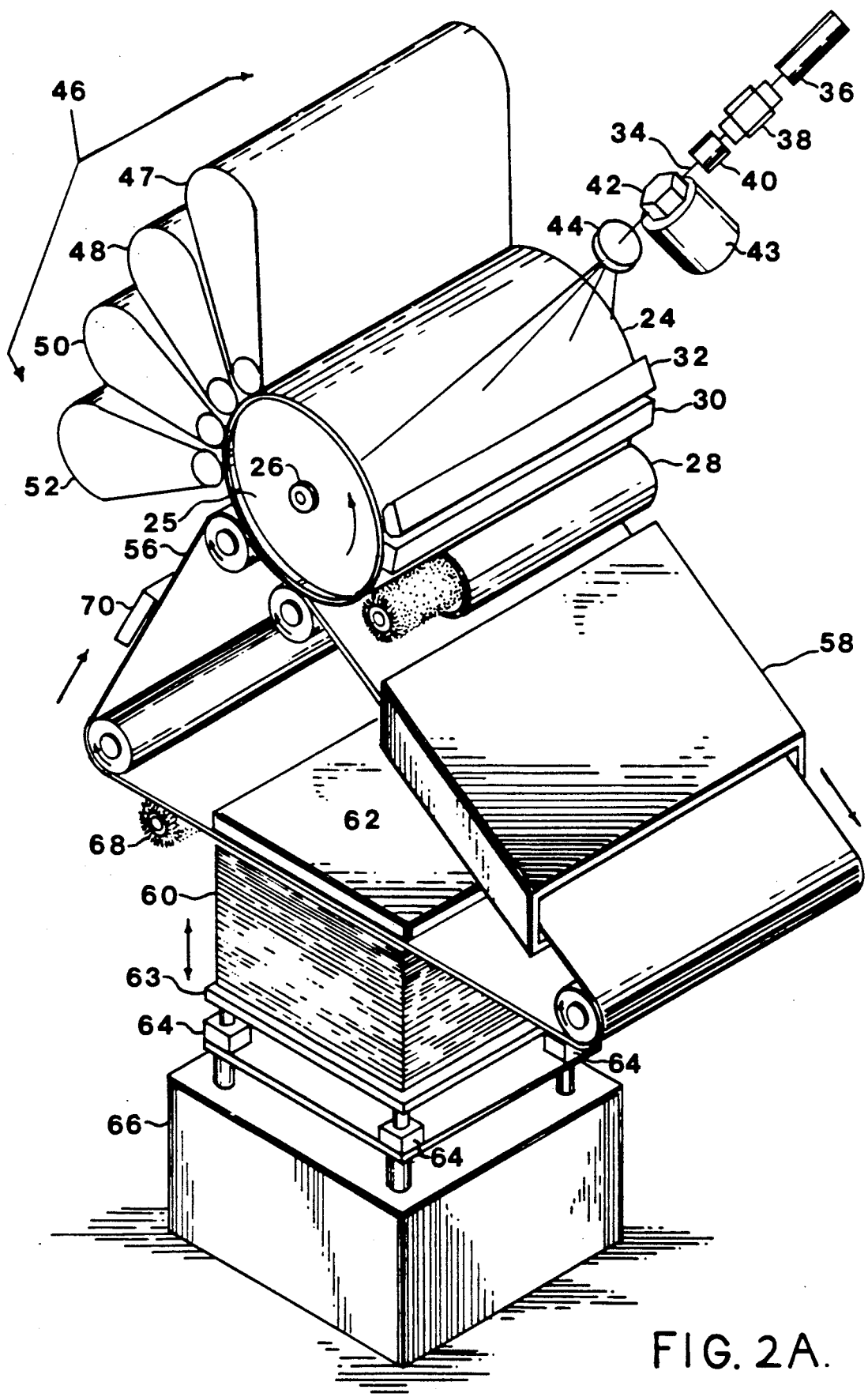
FIG. 2A shows a perspective view of an embodiment of the present invention that applies powdered resins, or the like, to a belt using electrophotography methods to form laminae.

12—computer aided design center
14—sectioning operation in computer's programming
16—operation of forming laminae
24—electrophotographic element
25—drum
26—shaft
28—cleaning station
30—discharge lamp
32—corona discharge device
34—laser beam
36—laser oscillator
38—modulator
40—beam expander
42—polygonal mirror
43—motor
44—imaging lens
46—developing station
47—development unit I
48—development unit II
50—development unit III
52—development unit IV
56—support belt
58—fixing station
60—sandwich stack
62—backup plate
63—press stage
64—solenoids
66—jack
68—cleaning station
70—corona discharge device
72—area of a first forming powder
74—area of a second forming powder
75—metal flake
76—induction heating coil
77—induction heating coil
78—insulating block
80—electrical lead
82—electrical lead
84—generator
86—endless belt
88—roller
90—roller 92—roll of semi-cured polymer
94—divider sheet
95—roller
96—roller
97—roller
98—sprayhead
99—cutter
100—jack
102—stage
104—steel metal sheets
106—uppermost sheet
108—platen
110—vacuum pump
112—hose
114—elastic coating material
115—rollers
116—track
118—router
120—catch basin
122—filter
124—pump
126—sprayhead
128—brush
130—rinse brush
132—hot air drier
134—adhesive applicator
136—sandwich stack
137—waste container
140—jack
142—stack of acrylic sheets
144—stage
146—jack
148—platen
150—single sheet photo cure acrylic
152—vacuum pump
154—hose
156—track
158—adhesive applicator
160—sandwich stack
162—stage
164—jack
166—laser projection system

DESCRIPTION OF THE EMBODIMENTS

Referring to the drawings, FIG. 1, is a schematic representation illustrating the method and arrangement of components necessary to practice the invention.

A designer at a computer aided design and drafting center 12 specifies the required parameters necessary to define an object to be designed. These parameters include defining the objects shape, surface texture, the interworking of parts and subassemblies and in the case of multi-material fabrication, the specification must include the materials to be used to manufacture the various areas of the object. Generally the sectioning process occurs through the least dimension of the object for reasons of economy. After the design has been completed, the computer's programming, represented at 14, sections the design into many electronic thin sections. These sections are stored in computer memory for later use. The sections are parallel planes that transverse the object at intervals corresponding to the physical thickness of the physical reconstructions of the sections, termed laminae in the art, later to be formed by the manufacturing apparatus of the invention.

The width that the sections are formed has relevance to the procedure. Coarse sections and corresponding laminae that have a larger thickness will produce objects with less detail, ragged surfaces on curved objects and will require greater tolerances between moving parts comprising the object. But objects formed by coarse sections are formed faster and therefore more economically. The converse is true with relatively thin sections which allow rendering of fine detail and close tolerances between working parts, but objects comprised of thin sections take longer to form. Sectional information is transmitted to the manufacturing apparatus, that by one of the herein disclosed embodiments sequentially forms laminae corresponding to the electronic sections from polymer, metal or the like. This operation is represented by reference number 16. Laminae thus formed are of the same thickness as sections generated in operation 14 and are fused together by the incorporation of a cohesive surface or by the addition of solvent, adhesive, or heat bonding to form a sandwich of laminae and thus the object.

DESCRIPTION OF THE PREFERRED EMBODIMENT

In order to comprehend the present embodiment a background presentation of the art of electrophotography is warranted.

Electrophotography, as disclosed in U.S. Pat. No. 2,297,691 Oct. 6, 1942 to Carlson, refers to a process wherein a layer of a photo-conductive material such as amorphous selenium or zinc oxide, mounted on an electroconductive substrate such as copper or aluminum receives a uniform charge from a corona discharge device, and when exposed to a light image to selectively dissipate the electrostatic charge in areas impinged by light thus forming an electrostatic latent image in a pattern corresponding to the original, is made visible by development with particles of an opposite charge. The aforementioned developed image is fixed by heat or solvent vapor and transferred to a support material such as paper to make a permanent copy of the original. In addition to the above mentioned Carlson process other electrophotographic methods are known in the art and have application as a transfer means of the present invention. Among these are the P.I.P. system which utilizes the physical properties of materials such as persistent internal polarization to form a latent image. Also the N P system that relies on the photoconductivity and electro-static capacitance of a photoconductive layer overlaid with an insulating layer to form the electrostatic latent image.

Referring now to FIG. 2A, there is shown an apparatus embodying the present invention, that uses electrophotography methods based on the aforementioned Carlson process but other methods known in the art will serve as well.

In more detail, a photoconductive insulating surface such as zinc oxide or amorphous selenium is supported on an electrically conductive substrate such as tin, copper, or aluminum to form an electrophotographic element 24, is curved along a radius to form a cylinderal drum 25. Drum 25 rotates about shaft 26 in the direction shown to move a portion of element 24 sequentially through a series of processing stations. Element 24 first passes through a cleaning station 28 where a brush and vacuum remove residual debris adhering to drum 25. Element 24 passes beneath discharge lamp 30 before passing beneath a corona discharge device 32 that imparts a relative uniform electrostatic potential to element 24.

The charged element 24 is exposed to a projected light pattern corresponding to an electronic section as generated by computer in step 14 of FIG. 1 but not shown in FIG. 2A. Projected light pattern, originates as a laser beam 34 generated by laser oscillator 36, is of a frequency corresponding to the spectral sensitivity of element 24. Laser beam 34 passes from laser oscillator 36 through a modulator 38. Modulator 38 using an electro-optical modulating element utilizing a known electro-optical effect or an acousto-optic modulating element utilizing a known acousto-optical effect causes the laser beam to modulate in response to computer control. If lasers capable of current modulation are used, modulator 38 is not needed. After passing modulator 38, the now modulated laser beam 34 is directed to a beam expander 40 that increases the diameter of laser beam 34 while maintaining the parallelity of the beam. After expansion, laser beam 34 is reflected from the mirrored faces of a rotationly mounted polygonal mirror 42. A galvanometer mirror also may be used. Supported by precision bearings polygonal mirror 42 is rotated on a shaft by a motor 43. Polygonal mirror 42 induces a lateral scanning motion in laser beam 34 relative to the rotational axis of drum 25.

Modulated scanning laser beam 34 passes through imaging lens 44. Lens 44 can be the type known in the art as having an $f-O$ characteristic wherein $r = f \cdot \theta$.

$f \cdot \theta$ lens allows even spacing of points of light across the focal plane; where $r$ = the focus position on the image plane, $\theta$ = the incident angle and $f$ = the focal length of the lens.

An ordinary imaging lens wherein $$= f \cdot \tan \theta$$

may be used if computer programming is such as to electronically correct sections for distortion inherent with the use of this type of lens in the above described scanning laser system.

It is also known in the art that the fineness of focus of a parallel beam of light is dependent upon the diameter of the beam incident upon the lens. So that a smaller focused spot diameter can be obtained for a given lens focal length and wavelength of light with a larger incident beam diameter. The aforementioned laser beam expander is employed for this reason.

In the above described fashion, a light image corresponding to electronic sections generated by computer is projected onto element 24 by line by line scanning, coordinated with rotational speed of drum 25 to selectively dissipate the charge thereon, thereby creating an electrostatic latent image on element 24.

Rotation of drum 25 advances element 24 and latent image contained thereon to developing station 46 comprised of a plurality of individual development units generally indicated by reference numerals 47, 48, 50, and 52, respectively. A fewer or greater number of development units can be employed depending on the complexity of the object to be manufactured by the invention.

Development units of the type employed in the present invention are well known in the art of color electrophotography whereby a plurality of development units dispense colored powders or toners to produce a built up color reproduction of an original. These developer units generally consist of an enclosure containing the various parts and toner or developer powder, an apparatus for transferring charged developer powder to the electrostatic drum such as conveyor, fir brushes, paddle wheels, or magnetic brushes. In the art of electrophotography finely divided particles used to make visible an electrostatic latent image are known as developer or toner particles. As the powders used in the present invention are used to form an object, the term forming powders shall be used.

Each of the development units 47, 48, 50 and 52, respectively apply forming powder to element 24 corresponding to a desired physical or chemical property of the object to be formed. For example, areas of the designed object that are desired to be translucent will be developed with forming powders that are translucent generally composed of a translucent thermoplastic resin powder while areas that are to be opaque are developed with opaque resins. Any number of thermoplastic or thermoset resins or metal combination can be used to impart to the final product the desired chemical and physical properties depending on the fixing method used.

A background filler material is dispensed by one of the development units the purpose of which is to provide support for overlying structure formed by successive layers of laminae. The background material, generally a lower melting point thermoplastic such as polyethylene or paraffin wax, is later removed by heat after the object is formed. Background material is later reused. After development, the now visible image is advanced and is electrostatically transferred to an intermediate support belt 56 which is a flexible substrate such as metal or polymer overlaid by a surface coating that does not readily form a mechanical bond with the forming powder. Such a material would be Teflon brand PTFE, Teflon is a trademark of E. I. duPont de Nemours & Co., Wilmington, Del. The surface of belt 56 is electronically biased to a potential having a polarity and magnitude sufficient to electrostatically attract forming powders from element 24 to belt 56. Belt 56 is adapted for movement in a recirculating path in synchronization with rotation of drum 25 enabling belt to receive, in superimposed registration, successive forming powder images corresponding to various materials needed to form each lamina. The aforementioned steps of charging element 24, exposing element 24 to modulated scanning laser image corresponding to a material component of a partial lamina, developing the electrostatic latent image recorded on element 24 with appropriate forming powder representing one specific material e.g. a translucent area, or an opaque area, and transferring the forming powder image to an endless belt in registration, are repeated a plurality of cycles, form a lamina containing forming powders necessary to form a single lamina. In addition background material is applied to all voids by the aforementioned process.

After the last transfer operation has been completed transfer belt 56 transports completed lamina to fixing station 58 where powdered lamina is made tacky by the application of external heat, solvent vapor or induction heating.

Rotation of belt 56 moves tackified lamina into a position of exact registry between sandwich stack 60, comprised of previously applied laminae, and backup plate 62. Sandwich stack 60 is supported by press stage 63 which is held in parallel planes with back-up plate 62 and is moved in an up and down movement by solenoid 64 supported by jack 66 that allows downward movement of sandwich stack 60. After tackified lamina is positioned in registry over previously applied laminae comprising stack 60, belt 56 is stopped and solenoid 64 is activated moving stage 63 upward by width of one lamina causing the uppermost portion of stack 60 to contact tackified lamina supported by belt 56 and to exert a slight compressive pressure, thereon, between upward moving stack 60 and rigidly fixed plate 62 causing lamina to adhere to stack 60. As stage 63 and plate 62 are planar and parallel with each other variations in laminae thickness are corrected by the pressing process. After a cooling period sufficient to render newly applied lamina non-tacky, cooling air may also be used to expedite this process, solenoids 64 are deactivated and retracted by spring assist. As stack 60 has greater cohesive propensity than belt 56, newly applied lamina is liberated from belt 56. Upon retraction of solenoids 64 jack 66 lowers by a width of approximately one lamina allowing sufficient clearance for belt 56 to move additional laminae into position. Belt 56 advances to cleaning station 68 that removes adhering debris on belt 56 before passing a corona discharge device 70 that charges belt 56 to aid in the removal of powdered laminae from element 24.

The aforementioned process of forming a lamina from forming powders, transferring powdered lamina to belt 56 tackifying at a fixing station, transferring lamina to stack 60 is repeated a plurality of cycles to form an object by composite buildup. After laminae sufficient to generate the object as designed have been fused in stack 60, completed object is freed from incasing background material by heat or solvent depending on materials used to form object, e.g. heat is used to remove incasing material such as paraffin wax, sulfur, polyethylene or combinations; solvents for low-density polystyrene.

Tackification is a process known in the art of electrophotography for rendering developing powders tacky while held by electrostatic attraction on an intermediate support. Solvent vapor fixing is described in U.S. Pat. Nos. 2,776,907 and 3,078,589, Feb. 26, 1963 both to Carlson. The process involves exposing developer particles to an external heating device sufficient to cause the particle to reach their melting point thus becoming tacky. It is also known in the art that passing developer particles through a chamber having a relatively high partial pressure of a solvent vapor will cause developer particles to absorb sufficient solvent to become tacky and thus adhere to a final support material.

Both of the aforedescribed methods of tackification are suitable, used singularly or in combination as a fixing tackification method for the present invention, when used with laminae comprised of various areas composed of forming powders with like physical and chemical properties. For example, an area of a laminae formed of a polystyrene forming powder of a first color and an area of the same lamina formed of a polystyrene forming powder of a second color when subjected to a uniform external heat source would become tacky in all areas in essence simultaneously. A fixing station that allows the use of a plurality of forming powders with different melting points used together in the same lamina is described in FIG. 2B which shows a fixing station for use with apparatus described in FIG. 2A that is suitable for causing a lamina comprised of an area of a first forming powder 72 of one melting point and a second area comprised of a second forming powder 74 of a separate higher melting point to reach their respective melting points simultaneously and thus become tacky simultaneously. This is accomplished by mixing small metal spheres or flakes shown generally by reference number 75 into the forming powder mixes. The thermoplastic resin forming powder with the higher melting point 74 has a relatively higher percentage of metal flakes 75 evenly dispersed into the resin than thermoplastic resin forming powders of a lower melting point 72. An induction heating coil induces induction heating in metal flakes 75 with proportionately more heat being generated within forming powders containing a higher percentage of flakes 75 corresponding to the higher melting point resins causing all of the forming powders to reach their melting points simultaneously.

Figure 2B:
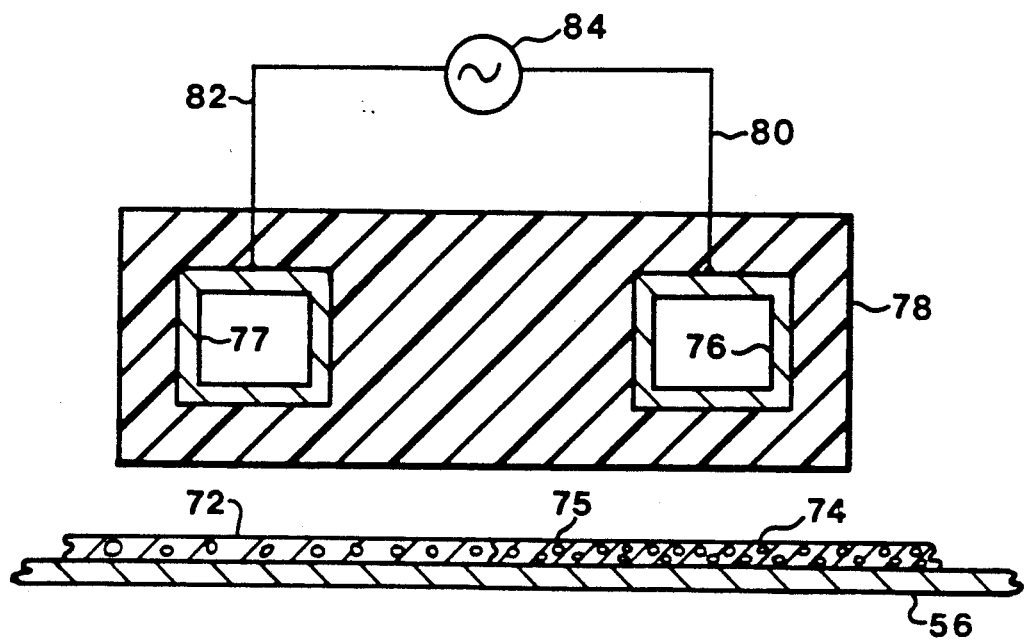
FIG. 2B shows a sectional view of a method for fixing powdered resin laminae formed by apparatus shown in FIG. 2A by the use of induction heating.

Referring to FIG. 2B in more detail, belt 56 composed of a non-metallic substrate such as woven fiberglass cloth impregnated with teflon and having a smooth surface moves a lamina comprised of a plurality of electrostatically adhered forming powder under a plurality of induction heating coils 76 and 77 incased in insulating block 78. Coils 76 and 77 are connected by electrical leads 80 and 82 to an appropriate source of alternating current such as schematically represented generator 84. Generator 84 oscillates in a frequency range that is suitable for heating the aforementioned metal flakes 75 incorporated in the forming powders. Alternating electrical current from generator 84 passing through leads 80 and 82 induce electromagnetic flux in coils 76 and 77 thereby causing metal flakes 75 incorporated into forming powders 72 and 74 to act as a heat sink or source of heat for melting adjacent particles of forming powder causing them to reach their melting point and become tacky. Belt 56 is activated to carry tackified lamina to sandwich stack 60 as described in previous discussion.

FIG. 2B shows coils located above belt 56 but induction heating coils may be located in various other configurations to achieve the same effect, e.g. coils may be located above and below belt 56.

DESCRIPTION OF THE SECOND EMBODIMENT

The second embodiment of the invention receives electronic sectional information generated by computer as described in the description relating to the first embodiment. This electronic information is used to spray a pattern of catalyst or hardener corresponding to the electronic sections sequentially on a roll of thin semicured polymer such as polyester or epoxy that has been perforated to allow the catalyst to become absorbed into the resin sheet. The thin sheets or laminae thus formed are stacked forming a sandwich similar to the stack formed by embodiment one. This sandwich stack of laminae is allowed to cure and then is subjected to a solvent that selectively dissolves the uncured material freeing the object thus formed. This embodiment is intended for use where it is desired to produce an object from a monolithic material that is relatively low in production costs.

Figure 3:
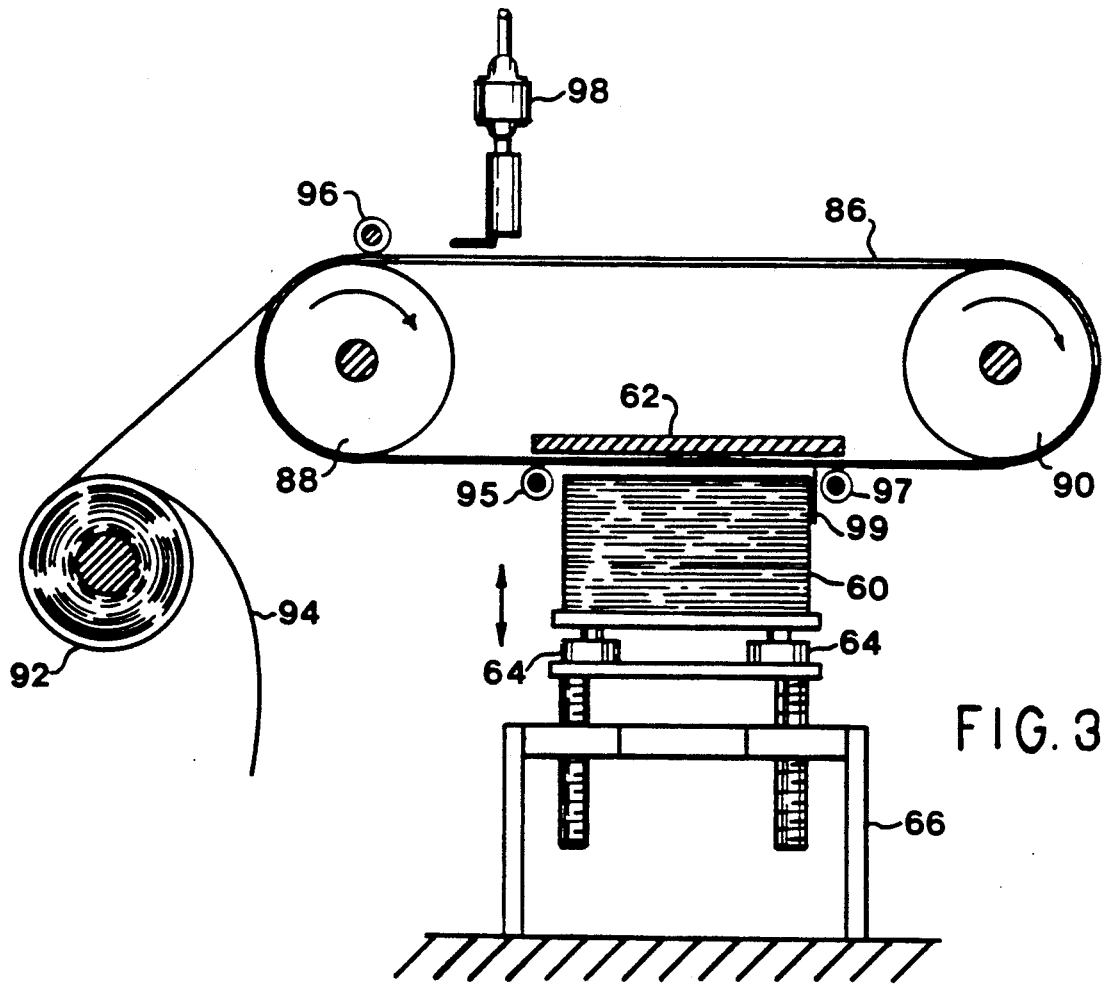
FIG. 3 shows a lateral sectional view of an embodiment of the present invention, that applies hardener or catalyst to a sheet of semi-cured resin by a moving print head or sprayer.

Referring now to FIG. 3 for a more detailed illustration of the second embodiment, an endless belt 86 is mounted for movement over horizontally arranged rollers 88 and 90. Belt 86 is formed of a smooth surfaced material such as Teflon brand PTFE or a belt formed of a substrate such as fiberglass, metal or other flexible material coated with Teflon to provide a stick resistant surface. A roll of semi-cured polymer resin 92 is provided that is of a thickness that corresponds to the thickness of the electronic sections generated by computer.

Resin sheet 92 is formed of polyester, epoxy resin or other such resins whereby a liquid hardener or catalyst can be added to cause hardening to occur in selective areas of sheet 92, e.g. polyester resins can be used that have incorporated hardeners that will cause the resin to cure when a catalyst such as methyl ethyl ketone peroxide is added. Roll of sheet resin 92 is rotated in synchronization with belt 86 causing sheet resin 92 to separate from divider sheet 94 and to pass between belt 86 and roller 96 whereby a slight pressure is applied causing sheet 92, which is slightly tacky, to smoothly adhere to belt 86. Rotation of belt 86 moves sheet 92 into position under spray head 98. Spray head 98 is known in the art as an ink jet printing apparatus and is adapted, in the present invention, to deposit liquid catalyst or hardener instead of ink. In such an apparatus, pressure oscillation is applied to the liquid catalyst or hardener in an ejection head by an electrostrictive vibrator under computer control thereby causing a jet or stream of liquid to be ejected from the head. After ejection the jet of liquid separates into small finely divided droplets which are electrostatically charged and electrostatically deflected on to the sheet of semi-cured resin. The ink ejection head moves laterally across sheet 92 in a line by line scanning motion to deposit catalyst or hardener to form laminae corresponding to sections as generated by computer. Sheet 92 is perforated with a plurality of finely spaced apertures to allow catalyst or hardener to be absorbed to facilitate the cure thereof. Belt 86, containing now printed on sheet 92 forming a lamina, is advanced by rotation of belt 86 causing lamina to be carried to sandwich stack 60 where in exact registration lamina is caused to adhere to previously applied laminae by pressure between rigidly mounted back-up plate 62 and upward moving sandwich stack 60 propelled by jack 66 and solenoids 64 previously described. Lamina is cut from sheet 92 by cutter 99 that moves across width of belt 86, severing lamina from sheet 92. Solenoids 64 are retracted allowing sandwich stack 60 to move away from belt 86. Rollers 95 and 97 aid the removal of lamina from belt 86 by holding belt 86 stationary and as the cohesive bonding between sandwich stack 60 and lamina is much greater than cohesive bonding between belt and lamina, lamina is removed from belt 86.

Completed sandwich stack 60 is allowed to rest for a period of time sufficient for all areas exposed to catalyst or hardener to cure. This period of time varies depending on specific resin used, ambient temperature and quantities of catalyst or hardener used per unit volume of resin. After cure is complete, sandwich stack 60 is subjected to a solvent such as acetone in the case of polyester resin which softens the uncured portions of the object allowing removal.

DESCRIPTION OF THE THIRD EMBODIMENT

FIG. 4A-FIG. 4F and the following discourse describe a method and apparatus of forming laminae by cutting laminae from a sheet material such as metal, organic polymers, and composite materials. A great variety of sheet materials whether rigid, semi-rigid or flexible can be employed as the raw stock material for the process. The lamina thus formed are joined with adhesive or solvent in registration to form the object as designed. This method has the advantage of being capable of forming objects employing laminae of relatively thick sections permitting a more rapid manufacture of an object. The process also permits the manufacture of relatively large objects when compared to other processes known in the art and herein disclosed. In addition this process is well adapted, though not limited, to the manufacture of objects containing vertical sided shapes such as rectangular and cylindrical objects. A block for an internal combustion engine would be an ideal candidate suited for this method.

Refer now to FIGS. 4A through 4F for an in-depth presentation of the method and description of the apparatus embodying the invention. FIGS. 4A through 4F show six steps or processing stations. FIG. A designates a storage area for sheets to be used in the process. Jack 100 applies upward motive force, either electric pneumatic or hydraulic against stage 102 supporting and causing to rise a stack of clean and degreased steel metal sheets 104. The uppermost metal sheet 106 is thereby moved into close proximity to platen 108. Vacuum pump 110 extracts air from hollow platen 108 through connecting hose 112. Evacuated air from platen 108 is replaced from the underside of platen 108 through a plurality of apertures located thereon thereby causing a region of lower relative air pressure to exist between the lower face of platen 108 and uppermost sheet 106 of stack 104. Partial vacuum existing on the underside of platen 108 causes the uppermost sheet 106 to adhere to the underside of platen 108. To aid in this adhesion the underside of platen 108 is coated with an elastic material 114 such as synthetic rubber that by forming suction cups around the aforementioned apertures create an effective air seal between bottom surface of platen 108 and sheet 106. Elastic material 114 can be made removable and thereby protecting platen from damage during routing operation and can be replaced when damaged.

Platen 108, supported on rollers 115, is mounted on track 116 for lateral movement by motive force not shown through a series of processing stations.

Figures 4A, 4B, 4C:
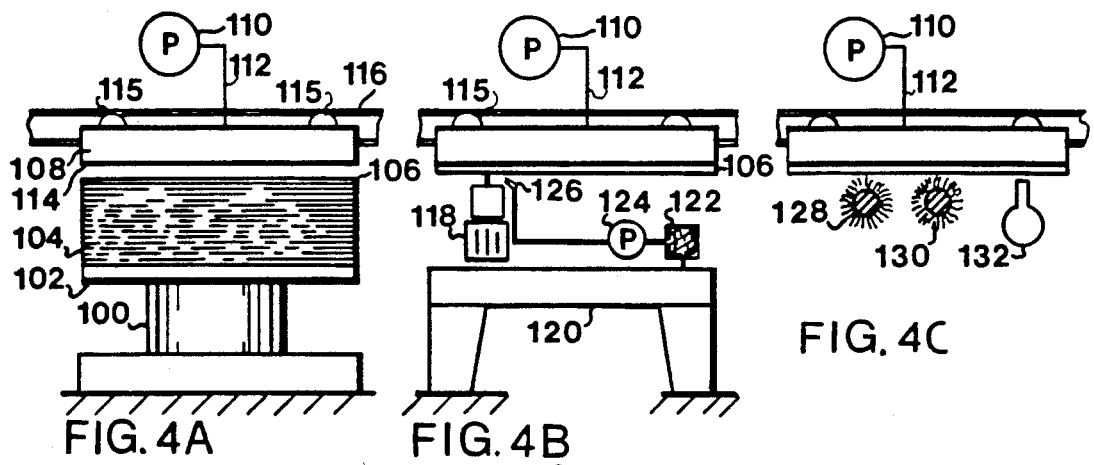
FIGS. 4A–4F show lateral sectional views of an embodiment of the present invention that forms laminae from sheet materials by use of a router and bonding.
Figures 4D, 4E, 4F:
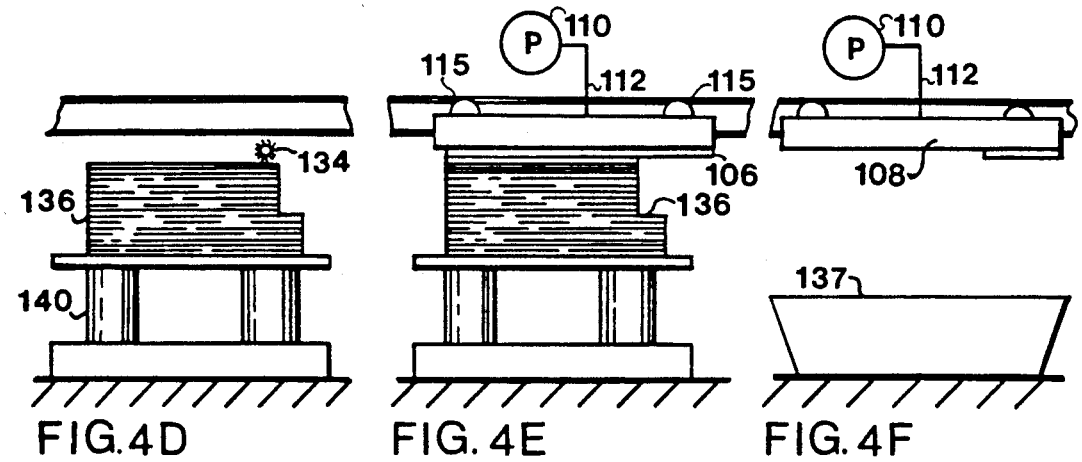

Platen 108 and adhering sheet 106 is laterally moved along track 116 to processing station shown in FIG. 4B, where router 118 is activated and engages sheet 106. Under computer direction router 118 makes a plurality of passes cutting the outline of computer generated electronic sections into sheet 106. Either a single or a plurality of passes will be required depending on the thickness and material composition of sheets used in the process. Steel sheet 106 is cut with a rotating industrial diamond bit that is liquid cooled during the cutting process with a water soluble or petroleum based lubricant. Lubricant is recovered by catch basin and settling tank 120 and is recycled through filter 122 by pump 124 to be applied through spray head 126 to area of sheet 106 being cut. Other materials will use different cutting methods. Plastic sheets such as polystyrene or polyethylene can be cut with stationary or rotationly mounted hot wire cutters or router bits of hardened steel or sharpened carbide tips. Many of the processes do not require liquid cooling in which case the liquid recycling unit described as reference Nos. 120, 122, 124 and 126 can be omitted. After sheet 106 has been cut to form a lamina representing a section as generated by computer, platen 108 passes from router station as shown in FIG. 4B to cleaning station as shown in FIG. 4C. Brush 128 applies cleaning solvent which removes residue of cutting operation and remaining lubricant. Rinse brush 130 removes residual cleaner while hot air drier 132 dries sheet 106 now lamina 106 before platen 108 moves lamina to processing station as shown in FIG. 4D. Adhesive applicator 134 applies a viscous epoxy mix to the upper face of previously applied laminae by a lateral motion across the face of upper most lamina. At processing station as shown in FIG. 4E platen 108 continues to move into exact registry over sandwich stack 136. Jack 140 lifts stack 136 to contact lamina 106 vacuum pump 110, causing lamina 106 to adhere to platen 108, reduces partial vacuum pressure. Jack 140 retracts pulling lamina free from platen 108. Waste material from sheet remains adhered to platen 108. Jack 140 lowers stack 136 approximately the width of one lamina plus adhesive width. Platen continues to progress along track 116 to dump station as shown in FIG. 4F, where waste is released and contained in waste container 137. Platen returns to station as shown in FIG. 4A, to repeat the process a plurality of times. After all laminae have been applied stack 136 is removed from apparatus and the adhesive joining laminae is allowed to completely cure. After curing, stack 136 which is now the completed object is subjected to surface grinding by hand operated pneumatic grinders fitted with abrasive grinding stones to finish and smooth the surface.

DESCRIPTION OF THE FOURTH EMBODIMENT

This embodiment of the present invention employs the use of thin sheets of photocure acrylic that when subjected to patterns of light; produced by a modulated, scanning laser, the output of which is in the ultraviolet portion of the spectrum, cures to form a hardened material. The patterns thus produced correspond to electronic sections of an object designed on a computer aided design and drafting system. The laminae, made in this manner, when joined with adhesive sequentially and in register with previously applied laminae, form a stack of laminae representing the object as designed by computer.

Figure 5:
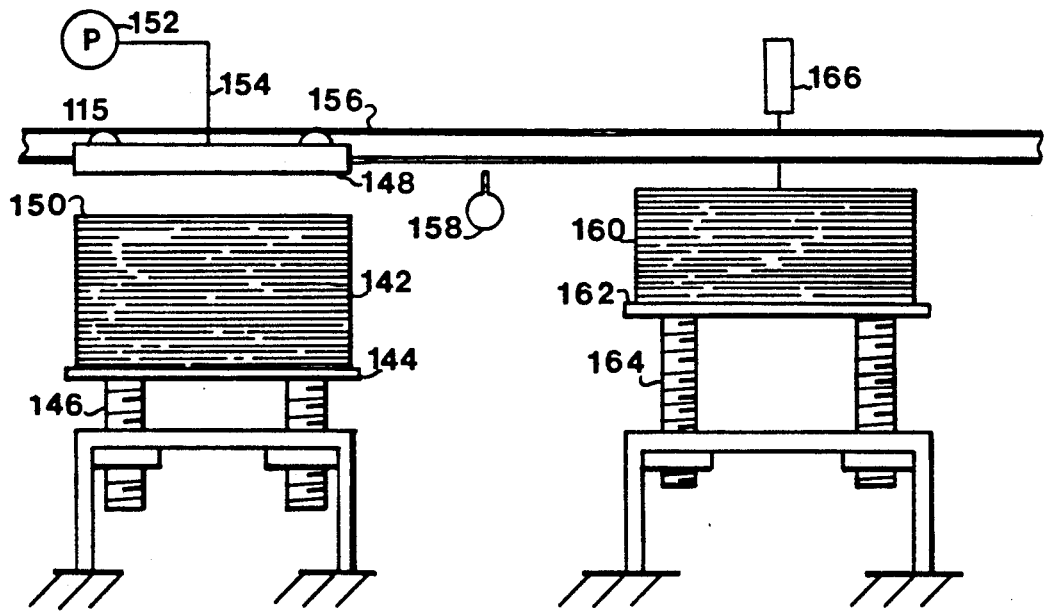
FIG. 5 shows a lateral sectional view of an embodiment that forms laminae by the use of sheet photo-cure polymers.

In more detail refer to FIG. 5, where is illustrated an apparatus for practicing the embodiment herein disclosed. A stack of photocure acrylic sheets 142 awaits use by apparatus and is supported by stage 144 that in turn is connected to jack 146 that is capable of up and down motion in minute increments. A rectangular hollow platen 148 is positioned above stack 142 at the beginning of the processing cycle. Jack 146 raises stack of acrylic sheets 142 until uppermost sheet 150 is in close proximity to platen 148. Single sheet 150 of photocure acrylic is lifted from stack 142 by partial vacuum generated by vacuum pump generally indicated by reference number 152 connected to platen 148 by way of hose 154. Platen 148 incorporates a plurality of apertures on its lower face and being hollow allows a reduced air pressure to occur between lower face and upper sheet of photocure acrylic. The relative higher air pressure existing on the under side of the upper most sheet of photocure acrylic causes adhesion to occur between sheet 150 and platen 148. Platen 148 is coated with synthetic rubber formed into suction cups around above mentioned apertures on the lower face of platen 148 to serve as an air seal to promote adhesion between sheet 150 and platen 148. Platen 148 is moved laterally along a rigidly mounted track 156 to adhesive applicator 158 which applies a viscous acrylic adhesive containing carbon black or other such highly light absorbing additive. Platen 148 advances sheet 150 and in exact registry applies sheet 150 to sandwich stack 160. Upward movement of stage 162 by jack 164 lifts stack 160 applying slight compressive force to stack 160 causing adhesive joining sheet 150 to stack 160 to spread evenly. As adhesive is viscous, it acts as a cushion, maintaining exact parallel relationship of sheet 150 with previously applied sheets forming stack 160. After placement, sheet 150 is freed from adhesion to platen 148 by the deactivation of vacuum pump 152. Platen 148 returns along track 156 to starting position over sheet stack 142. Newly applied sheet 150 is scanned with a light pattern corresponding to a computer generated section. Light pattern is generated by a monochromatic laser in the ultraviolet portion of the spectrum and is modulated and caused to scan employing techniques as described in disclosure relating to embodiment one. Reference No. 166 generally refers to laser projection system. The carbon black additive contained in adhesive layer, bonding sheet 150 to stack 160, serves as a light shield preventing re-exposure of previously applied sheets in stack 160. The image projected by scanning ultraviolet laser system 166, selectively hardens or cures sheet 150 now a lamina corresponding to a computer generated section. The process of applying an unexposed sheet of photocure acrylic to stack 160 with light blocking adhesive then exposing the sheet with a pattern of light to effect a selective cure is continued a plurality of times until stack 160 is complete. After all sections have been represented by laminae in stack 160, stack 160 is removed from the apparatus and the uncured areas of stack 160 are removed by manual cutting and the use of solvent. The object thus formed as stack 160 is subjected to a post cure accomplished with ultraviolet curing lamps that completely hardens the object.

SUMMARY, RAMIFICATIONS, AND SCOPE

Thus the reader will see that the computer aided manufacturing method of this invention can be used to economically manufacture objects and parts from a variety of materials for a wide range of applications. The process produces parts and objects both economically as well as rapidly.

The invention has many advantages over previously used methods for producing parts. A large selection of materials may be used rather than just plastics, making available to the designer a wider range of physical and chemical properties. The designer can work directly from a computer aided design system to manufacture a working part and not just a prototype.

Furthermore, the invention has the additional advantages in that:
  it permits the production of objects in a variety of colors without having to manufacture sub-assemblies for post manufacture assembly.
  it allows for the design of an object at one location and for the design information to be recorded on electronic storage medium or transmitted for use at a later time and or at a different location. Therefore one designer can serve several manufacturing apparatuses in remote locations.
  it manufactures objects with moving parts that are created by the apparatus fully assembled with parts in working order.

Although the description above contains many specificities this should not be construed as limiting the scope of the invention but as merely providing illustrations of some of the presently preferred embodiments of this invention. For example, embodiments three and four could be formed with a plurality of platens mounted on a circular belt allowing the steps at each processing station to be carried out simultaneously on several sheets or laminae thereby reducing the time required to manufacture an object. Thus the scope of the invention

I claim:

1. A system for manufacturing a three-dimensional object directly from design that comprises:
   a. means for receiving electronic sectional data corresponding to an electronic representation of the object to be manufactured;
   b. means for exposing a charged electro-photographic element with an electromagnetic radiation pattern corresponding to said electronic section to form an electrostatic latent image on said electrophotographic element;
   c. means for applying a plurality of forming powders to said electrostatic latent image contained on said electrophotographic element to form a physical lamina;
   d. means for transferring said physical lamina to an intermediate support;
   e. means for causing said physical lamina to become tacky;
   f. means for transferring and bonding said physical lamina to previously formed laminae, and building up a physical replication of said object in a step-wise fashion whereby the three dimensional object is auto-matically formed from a composite of laminae.

2. The system as set forth in claim 1, wherein said means for causing said physical lamina to become tacky is applied heat.

3. The system as set forth in claim 1, wherein said means for causing said physical lamina to become tacky is an applied solvent vapor.

4. The system as set forth in claim 1, wherein said means for causing said physical lamina to become tacky is induction heating.

5. The system as set forth in claim 4, further including a surface, a plurality of forming powder areas, supported on said surface, each comprising a layer of meltable forming powder, each of a different thermal melting point, said forming powders comprising a plurality of finely divided metal flakes disbursed within, said forming powders of a relatively higher melting point containing proportionately a higher percentage of said metal flakes than forming powders of a relatively lower melting point, whereby said induction heating means by induction heating of said metal flakes induces more rapid heating in said forming powder comprised of a higher percentage of said metal flakes causing all of said forming powder areas to reach their respective melting points and thus to become tacky, substantially at the same time.

6. The system as set forth in claim 1, wherein said forming powders that are used to from said physical lamina, are thermoplastic polymers.

7. The system as set forth in claim 1, wherein a plurality of forming powders are used to form said lamina, each of said forming powders with a different physical property.

8. A system for manufacturing a three-dimensional object directly from design whereby planar slices of the design of said three-dimensional object are sequentially formed and joined to create a replica of the design of said three-dimensional object, said system comprising:
   a. means for deriving graphic image data output defining successive adjacent cross-sections of the design of said three-dimensional object to be manufactured;
   b. a sheet of curable polymer;
   c. means for spraying a pattern of catalyst or hardener upon said sheet of curable polymer initiating a curing process, said pattern corresponding to said graphic image data, whereby said sheet of curable polymer is selectively cured to form a physical lamina corresponding to said graphic image data;
   d. means for moving said lamina relative to the forming means;
   e. means for transferring and joining said physical lamina to previously formed laminae as they are formed and building up a physical replication of said design of said three-dimensional object in a step-wise fashion whereby said three-dimensional object is automatically formed from a composite of laminae.

9. An automated manufacturing system using thin sections comprising:
   a. means for deriving graphic image data output, said graphic image data defining successive adjacent cross-sections of a three-dimensional object to be manufactured;
   b. means for exposing a charged electro-photographic element with an electromagnetic radiation pattern corresponding to said graphic image data, to form an electrostatic latent image on said electrophotographic element;
   c. means for applying a plurality of forming powders to said electrostatic latent image contained on said electro-photographic element to form a physical lamina;
   d. means for moving said physical lamina relative to the forming means;
   e. means for causing said physical lamina to become tacky;
   f. means for transferring said physical lamina to previously formed laminae;
   g. means for joining said laminae as they are formed and building up a physical replication of said object in a step-wise fashion whereby said three-dimensional object is automatically formed from a composite of laminae.

10. The manufacturing system as set forth in claim 9, wherein said means for causing said physical lamina to become tacky is applied heat.

11. The manufacturing system as set forth in claim 9, wherein said means for causing said physical lamina to become tacky is an applied solvent vapor.

12. The manufacturing system as set forth in claim 9, wherein said means for causing said physical lamina to become tacky is induction heating.

13. The manufacturing system as set forth in claim 12, further including a surface, a plurality of forming powder areas, supported on said surface, each comprising a layer of meltable forming powder, each of a different thermal melting point, said forming powders comprising a plurality of finely divided metal flakes disbursed within, said forming powders of a relatively higher melting point containing proportionately a higher percentage of said metal flakes than forming powders of a relatively lower melting point, whereby said induction heating means by induction heating of said metal flakes induces more rapid heating in said forming powder comprised of a higher percentage of said metal flakes causing all of said forming powder areas to reach their respective melting points and thus to become tacky, substantially at the same time.

14. The manufacturing system as set forth in claim 9, wherein a plurality of forming powders are used to form said lamina, each of said forming powders with a different physical property.

* * * * *